(12) United States Patent
Wooldridge

(10) Patent No.: US 6,515,909 B1
(45) Date of Patent: Feb. 4, 2003

(54) FLASH MEMORY DEVICE WITH A VARIABLE ERASE PULSE

(75) Inventor: Corley B. Wooldridge, Gilroy, CA (US)

(73) Assignee: Micron Technology Inc., Boise, ID (US)

(*) Notice: Subject to any disclaimer, the term of this patent is extended or adjusted under 35 U.S.C. 154(b) by 0 days.

(21) Appl. No.: 09/972,426

(22) Filed: Oct. 5, 2001

(51) Int. Cl.$^7$ ................................................ G11C 16/06
(52) U.S. Cl. .......................... 365/185.22; 365/185.29; 365/185.19
(58) Field of Search ..................... 365/185.22, 185.29, 365/185.19

(56) References Cited

U.S. PATENT DOCUMENTS

| | | | |
|---|---|---|---|
| 5,636,166 A | 6/1997 | Roohparvar | 365/194 |
| 5,680,350 A | 10/1997 | Lee | 365/185.24 |
| 5,784,316 A * | 7/1998 | Hirata | 365/185.22 |
| 5,801,985 A | 9/1998 | Roohparvar et al. | 365/185.01 |
| 5,901,108 A | 5/1999 | Roohparvar | 365/233 |
| 5,901,194 A | 5/1999 | Chevallier | 377/20 |
| 6,020,775 A * | 2/2000 | Chevallier | 327/132 |
| 6,081,575 A | 7/2000 | Chevallier | 377/20 |
| 6,115,291 A * | 9/2000 | Lakhani | 365/185.09 |
| 6,188,613 B1 | 2/2001 | Manning | 365/185.33 |
| 6,248,629 B1 * | 6/2001 | Liu et al. | 438/258 |
| 6,272,586 B1 | 8/2001 | Roohparvar et al. | 711/103 |
| 6,356,974 B2 | 3/2002 | Chevallier | 711/103 |

* cited by examiner

Primary Examiner—Huan Hoang
(74) Attorney, Agent, or Firm—Schwegman, Lundberg, Woessner & Kluth P.A.

(57) ABSTRACT

A method of operating a flash memory device according to an embodiment of the present invention includes selecting a flash cell in a flash memory device to undergo an erase, applying a long erase pulse to the flash cell, and reading the flash cell. For each time the flash cell is read and is not in an erased state, the method includes applying a short erase pulse to the flash cell, counting the short erase pulse, and reading the flash cell. Finally, a length of the long erase pulse is adjusted based on the counted number of short erase pulses that were applied to the flash cell. The length of the long erase pulse may be increased if the counted number of short erase pulses is more than a high number of pulses, or it may be decreased if the counted number of short erase pulses is less than a low number of pulses. The length of the long erase pulse may be adjusted based on a past average of short erase pulses applied to the flash cell, or a quantity representing short erase pulses applied to the flash cell over a selected number of prior erases of the flash cell. The flash memory device may have a control circuit with elements to implement the method.

40 Claims, 12 Drawing Sheets

FLASH MEMORY DEVICE WITH A VARIABLE ERASE PULSE

FIELD OF THE INVENTION

The present invention relates generally to memory devices, and more particularly, to a flash memory device with a variable erase pulse.

BACKGROUND

Electrically erasable and programmable read-only memory devices having arrays of what are known as flash cells, also called flash EEPROMs or flash memory devices, are found in a wide variety of electrical devices. A flash memory device is typically formed in an integrated circuit. A conventional flash cell, also called a floating gate transistor memory cell, is similar to a field effect transistor, having a channel region between a source and a drain in a substrate and a control gate over the channel region. In addition the flash cell has a floating gate between the control gate and the channel region. The floating gate is separated from the channel region by a layer of gate oxide, and an inter-poly dielectric layer separates the control gate from the floating gate. Both the control gate and the floating gate are formed of doped polysilicon. The floating gate is floating or electrically isolated. The flash memory device has a large number of flash cells in an array where the control gate of each flash cell is connected to a word line and the drain is connected to a bit line, the flash cells being arranged in a grid of word lines and bit lines.

A flash cell is programmed by applying approximately 10 volts to the control gate, between 5 and 7 volts to the drain, and grounding the source and the substrate to induce hot electron injection from the channel region to the floating gate through the gate oxide. The voltage at the control gate determines the amount of charge residing on the floating gate after programming. The charge affects current in the channel region by determining the voltage that must be applied to the control gate in order to allow the flash cell to conduct current between the source and the drain. This voltage is termed the threshold voltage of the flash cell, and is the physical form of the data stored in the flash cell. As the charge on the floating gate increases the threshold voltage increases.

One type of flash memory device includes an array of multi-bit or multi-state flash cells. Multi-state flash cells have the same structure as ordinary flash cells and are capable of storing multiple bits of data in a single cell. A multi-bit or multi-state flash cell has multiple distinct threshold voltage levels over a voltage range. Each distinct threshold voltage level corresponds to a set of data bits, with the number of bits representing the amount of data which can be stored in the multi-state flash cell.

Data is stored in conventional flash memory devices by programming flash cells that have been previously erased. A flash cell is erased by applying an erase pulse of approximately −10 volts to the control gate, applying approximately 5 volts to the source, grounding the substrate and allowing the drain to float. In an alternate method of erasure the control gate is grounded and an erase pulse of approximately 12 volts is applied to the source. The electrons in the floating gate are induced to pass through the gate oxide to the source by Fowler-Nordheim tunneling such that the charge in the floating gate is reduced and the threshold voltage of the flash cell is reduced. The flash cell is then read in a manner described below to determine if it is erased. If the flash cell is not erased, another erase pulse is applied to the flash cell.

A flash cell is read by applying approximately 5 volts to the control gate, approximately 1 volt to the drain, and grounding the source and the substrate. The flash cell is rendered conductive and current between the source and the drain is sensed to determine data stored in the flash cell. The current is converted to a voltage that is compared with one or more reference voltages in a sense amplifier to determine the state of the flash cell. The current drawn by a flash cell being read depends on the amount of charge stored in the floating gate.

As flash memory devices age with use they tend to wear, or change physically, and their operational characteristics change. The operational efficiency of a flash memory device can decline over time due to these changes in its physical and operational characteristics. There remains a need for a flash memory device that may be operated efficiently over its entire operating life.

SUMMARY OF THE INVENTION

The above mentioned and other deficiencies are addressed in the following detailed description. A method of operating a flash memory device according to an embodiment of the present invention includes selecting a flash cell in a flash memory device to undergo an erase, applying a long erase pulse to the flash cell, and reading the flash cell. For each time the flash cell is read and is not in an erased state, the method includes applying a short erase pulse to the flash cell, counting the short erase pulse, and reading the flash cell. Finally, a length of the long erase pulse is adjusted based on the counted number of short erase pulses that were applied to the flash cell. The length of the long erase pulse may be increased if the counted number of short erase pulses is more than a high number of pulses, or it may be decreased if the counted number of short erase pulses is less than a low number of pulses. The length of the long erase pulse may be adjusted based on a past average of short erase pulses applied to the flash cell, or a quantity representing short erase pulses applied to the flash cell over a selected number of prior erases of the flash cell. The flash memory device may have a control circuit with elements to implement the method.

Advantages of the present invention will be apparent to one skilled in the art upon an examination of the detailed description.

DETAILED DESCRIPTION

Figure 1:
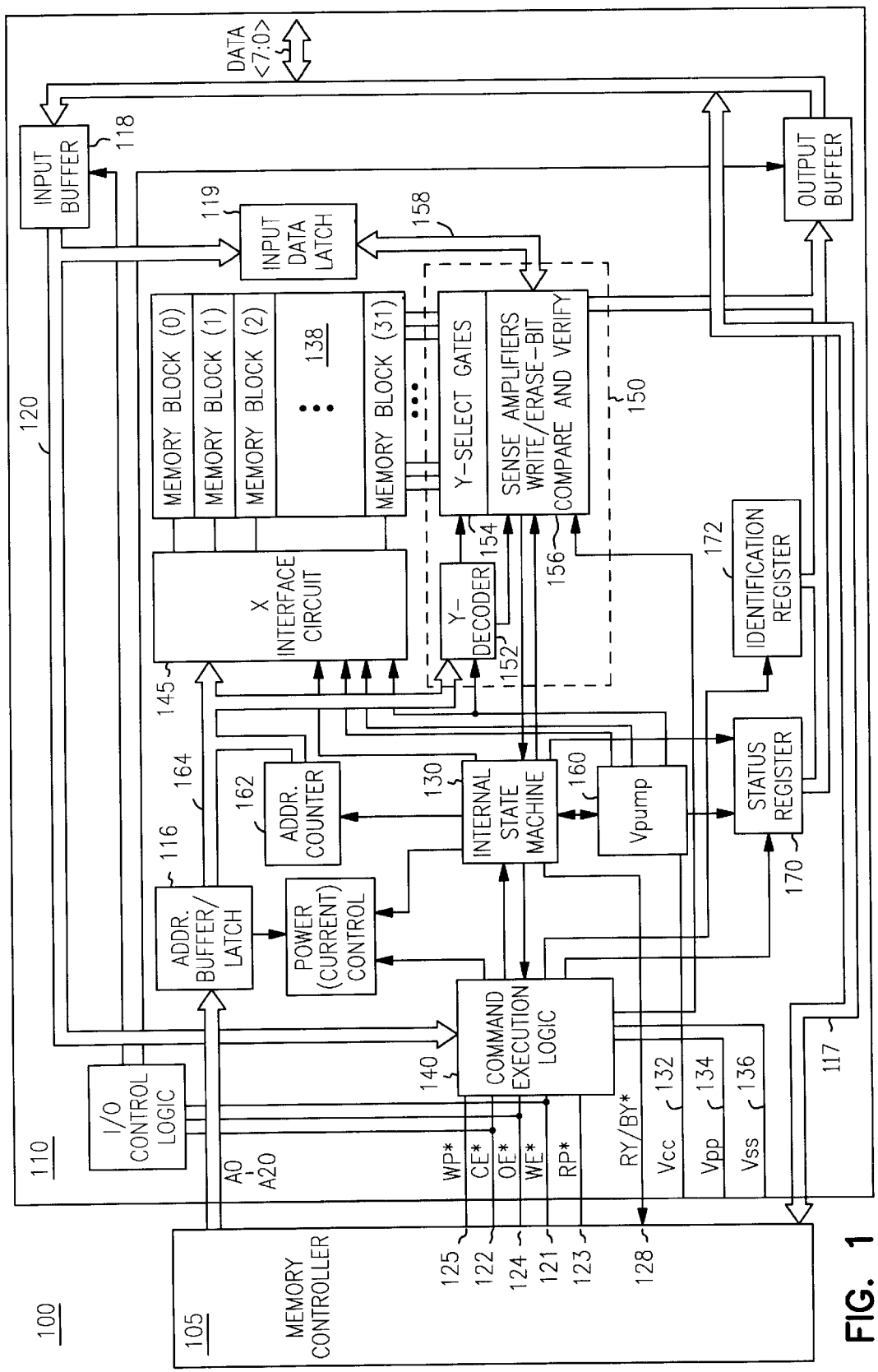
FIG. 1 is a block diagram of a flash memory system according to an embodiment of the present invention.

In the following detailed description of exemplary embodiments of the present invention, reference is made to the accompanying drawings which form a part hereof, and in which are shown by way of illustration specific exemplary embodiments in which the present invention may be practiced. These embodiments are described in sufficient detail to enable those skilled in the art to practice the present invention, and it is to be understood that other embodiments may be utilized and that logical, mechanical, electrical and other changes may be made without departing from the spirit or scope of the present invention. The following detailed description is, therefore, not to be taken in a limiting sense, and the scope of the present invention is defined only by the claims.

In this description, a threshold voltage of a transistor is the voltage that must be applied to a control gate of the transistor in order to allow the transistor to conduct current between a source and a drain. In this description, a transistor or a flash cell is described as being in an active state or activated or switched on when it is rendered conductive by a control gate voltage that exceeds its threshold voltage, and the transistor or flash cell is described as being in an inactive state or switched off when the control gate voltage is below the threshold voltage and the transistor or flash cell is non-conductive. A digital signal of 1 may also be called a high signal and a digital signal of 0 may also be called a low signal.

The terms wafer and substrate may be used in the following description and include any structure having an exposed surface with which to form an integrated circuit (IC) according to embodiments of the present invention. The term substrate is understood to include semiconductor wafers. The term substrate is also used to refer to semiconductor structures during fabrication, and may include other layers that have been fabricated thereupon. The term substrate includes doped and undoped semiconductors, epitaxial semiconductor layers supported by a base semiconductor, or semiconductor layers supported by an insulator, as well as other semiconductor structures well known to one skilled in the art. The term insulator is defined to include any material that is less electrically conductive than materials generally referred to as conductors by those skilled in the art.

The term "horizontal" as used in this application is defined as a plane substantially parallel to the conventional plane or surface of a wafer or substrate, regardless of the orientation of the wafer or substrate. The term "vertical" refers to a direction substantially perpendicular to the horizonal as defined above. Prepositions, such as "on," "upper," "side" (as in "sidewall"), "higher," "lower," "over" and "under" are defined with respect to the conventional plane or surface being on the top surface of the wafer or substrate, regardless of the orientation of the wafer or substrate.

The term "source/drain" refers generally to the terminals or diffusion regions of a field effect transistor. A terminal or a diffusion region may be more specifically described as a "source" or a "drain" on the basis of a voltage applied to it when the field effect transistor is in operation.

P-type conductivity is conductivity associated with holes in a semiconductor material, and n-type conductivity is conductivity associated with electrons in a semiconductor material. Throughout this specification the designation "n+" refers to semiconductor material that is heavily doped n-type semiconductor material, e.g., monocrystalline silicon or polycrystalline silicon. Similarly, the designation "p+" refers to semiconductor material that is heavily doped p-type semiconductor material. The designations "n–" and "p–" refer to lightly doped n and p-type semiconductor materials, respectively.

A diffusion region in a substrate described herein according to embodiments of the present invention may also be called a moat or a well or a tank. The diffusion region may be an n-type diffusion region or a p-type diffusion region, and the substrate may be a silicon substrate. Transistors and other devices described herein according to embodiments of the present invention may have moats or wells that may be formed in other moats or wells or tanks rather than substrates. Such moats or wells or tanks may be situated with other moats or wells or tanks, or within other moats or wells or tanks, in a larger substrate. The moats or wells or tanks may also be situated in a silicon-on-insulator (SOI) device.

FIG. 1 is a block diagram of a flash memory system 100 according to an embodiment of the present invention. The memory system 100 includes a memory controller 105 and a flash memory integrated circuit (IC) 110. The controller 105 includes a control device such as a microprocessor to provide interface signals to the IC 110. The interface signals include address signals provided over multiple address lines A0–A20 to an address buffer and latch 116, and data signals communicated over multiple data lines DATA <7:0>. The IC 110 has more than 21 address lines, and more than 8 data lines in alternate embodiments of the present invention. The data lines DATA <7:0> are coupled to an input buffer 118 which stores the data signals for transfer to an input data latch 119 over multiple internal data lines 120. Other interface signals provided by the controller 105 include a write enable signal WE* at node 121, a chip enable signal CE* at node 122, a reset/power-down signal RP* at node 123, an output enable signal OE* at node 124, and a write protect signal WP* at node 125, all of which are active low signals. The IC 110 provides a status signal RY/BY* to the controller 105 at node 128 to indicate the status of an internal state machine 130. The IC 110 also receives a positive power supply voltage $V_{cc}$ at node 132, a write/erase supply or programming voltage $V_{pp}$ at node 134, and a reference voltage such as a substrate ground voltage $V_{ss}$ at node 136 which is approximately 0 Volts. Each of the address lines A0–A20, data lines DATA <7:0>, and nodes 121–128 is terminated at a pin (not shown) in the IC 110 that may be coupled to the controller 105 by a line such as a control line.

The IC 110 includes an array 138 of floating gate transistor memory cells or flash cells arranged in 32 flash cell blocks. Each block in the array 138 contains 64 kilobytes of flash cells. A command execution logic module 140 receives the above-described interface signals from the controller 105. The module 140 controls the state machine 130 which controls individual acts necessary for programming, reading, and erasing the flash cells in the array 138. More specifically, the state machine 130 controls detailed operations of the IC 110 such as providing write and block erase timing sequences to the array 138 through an X-interface circuit 145 and a Y-interface circuit 150.

The Y-interface circuit 150 provides access to individual flash cells through bit lines in the array 138. Bit lines in the Y-interface circuit 150 are connected to a bit line driver circuit (not shown). The Y-interface circuit 150 includes a Y-decoder circuit 152, Y-select gates 154, and sense amplifiers and write/erase bit compare and verify circuits 156. The X-interface circuit 145 provides access to rows of flash cells through word lines in the array 138, which are electrically coupled to the control gates of the flash cells in the array 138. The X-interface circuit 145 includes decoding and control circuits for erasing the flash cells in the array 138. The write/erase bit compare and verify circuits 156 are coupled to exchange data with the input data latch 119 over a set of internal data lines 158.

The IC 110 includes a charge pump circuit 160 to generate an elevated voltage Vpump for programming, erasing, or reading the flash cells in the array 138. The pump circuit 160 is coupled to receive the positive power supply voltage $V_{cc}$ from the node 132 and provides the voltage Vpump to the X-interface circuit 145, the Y-decoder circuit 152, and the state machine 130 over a plurality of lines. In an alternate embodiment of the present invention, the pump circuit 160 may provide a different elevated voltage over each of the lines shown in FIG. 1. The state machine 130 controls an address counter 162 which is capable of providing a sequence of addresses on an internal set of address lines 164 coupled between the address buffer and latch 116, the X-interface circuit 145, and the Y-decoder circuit 152.

The IC 110 also includes a status register 170 coupled to receive signals from the state machine 130, the module 140, and the pump circuit 160. Bits in the status register 170 indicate the status of the IC 110, and the status register 170 is read by the controller 105. The IC 110 also includes an identification register 172 coupled to receive signals from the module 140.

Figure 2:
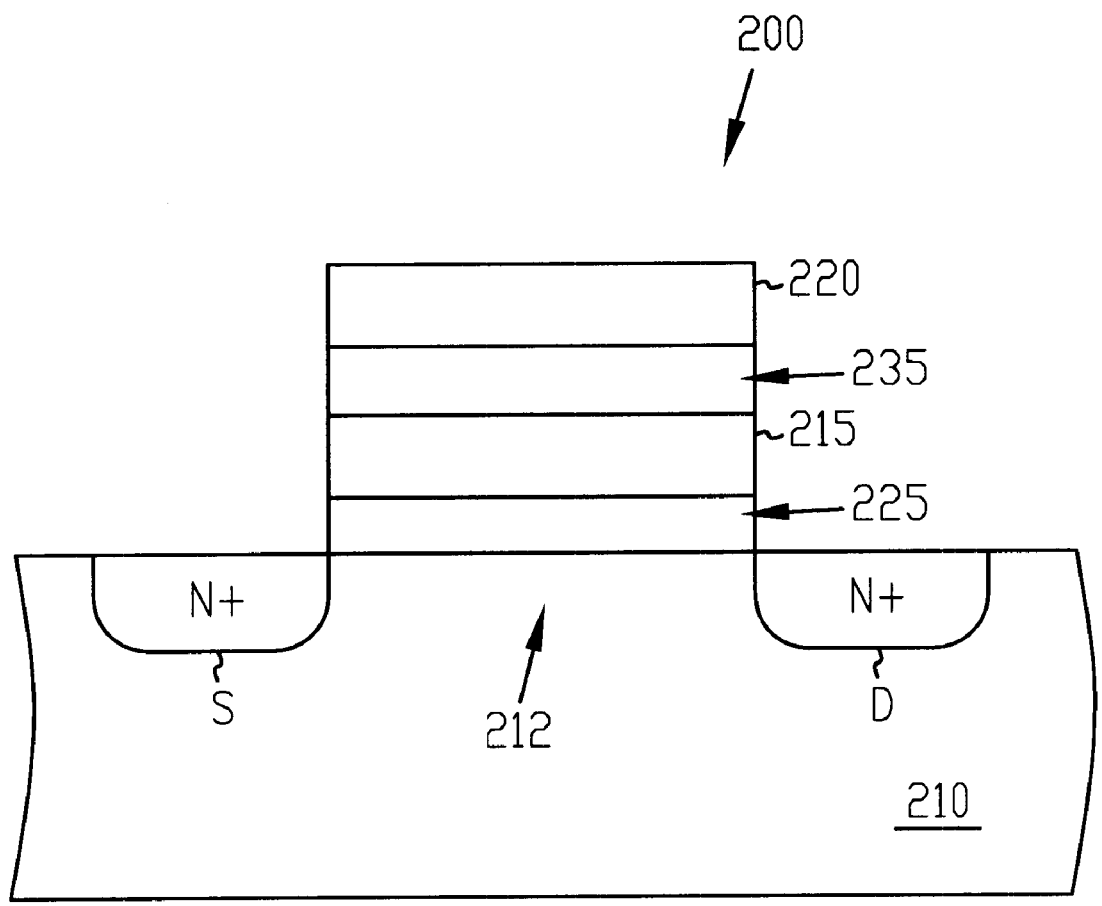
FIG. 2 is a cross-sectional view of a flash cell according to an embodiment of the present invention.

A cross-sectional view of a flash cell 200 is shown in FIG. 2 according to an embodiment of the present invention. The flash cell 200 includes an n+-type source S and an n+-type drain D formed in a p-type silicon substrate 210. The source S and the drain D are separated by a channel region 212 in the substrate 210. The flash cell 200 includes a floating gate 215 and a control gate 220, both formed of doped polysilicon. The floating gate 215 is floating or electrically isolated. A layer of gate oxide 225 separates the floating gate 215 from the channel region 212 in the substrate 210. An inter-poly dielectric layer 235 separates the floating gate 215 from the control gate 220. The substrate 210 may be silicon or another semiconductor material, or it may be a thin semiconductor surface layer formed on an underlying insulating portion, such as a semiconductor-on-insulator (SOI) structure or other thin film transistor technology. The source S and the drain D are formed by conventional complementary metal-oxide-semiconductor (CMOS) processing techniques.

The flash cell 200 shown in FIG. 2 is an n-channel floating gate transistor memory cell. In another embodiment of the present invention, the flash cell 200 may be a p-channel floating gate transistor memory cell with a p+-type source S and a p+-type drain D formed in an n-type silicon substrate 210.

Figure 3:
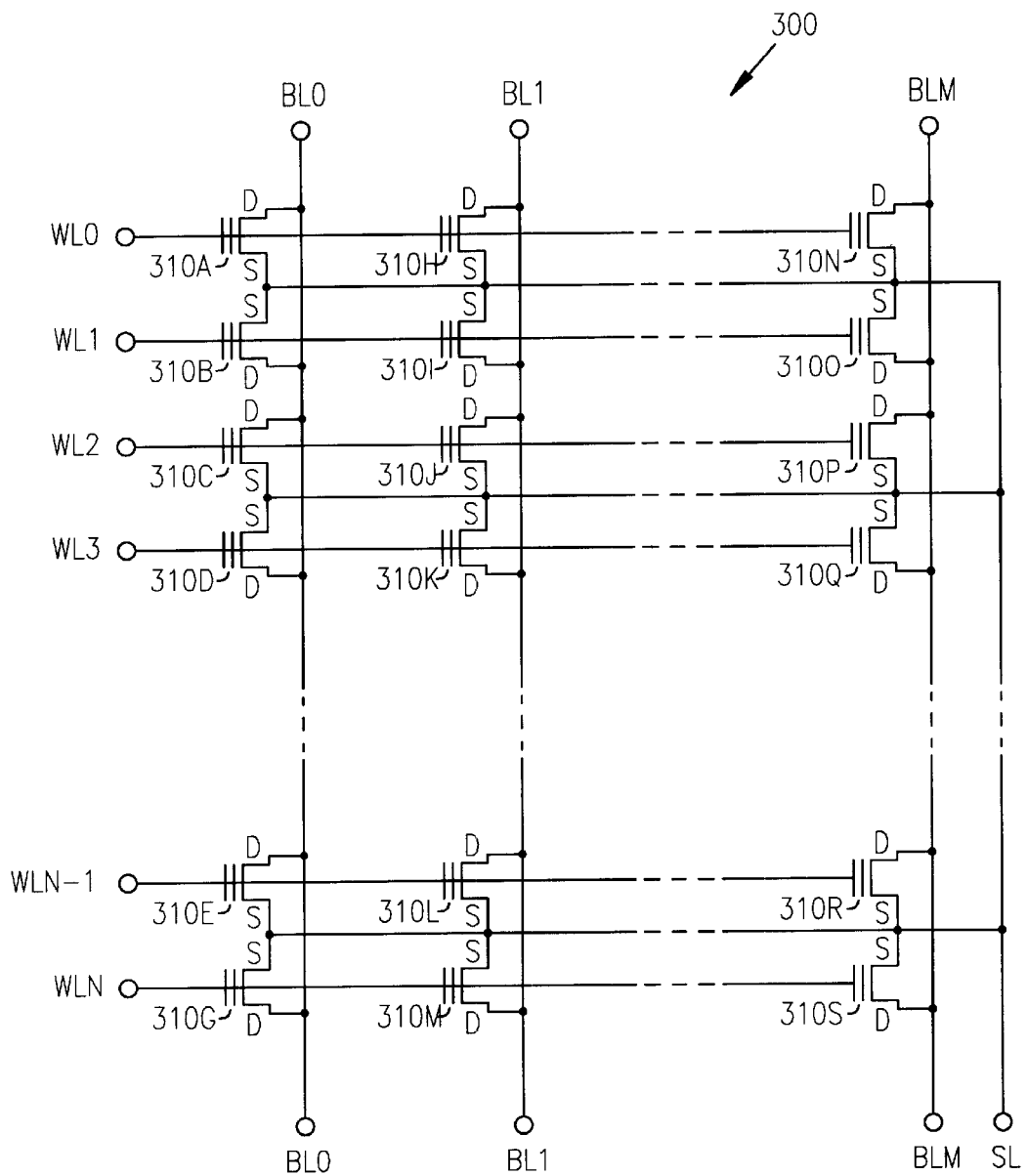
FIG. 3 is an electrical schematic diagram of a block of flash cells in the memory system of FIG. 1 according to an embodiment of the present invention.

FIG. 3 is an electrical schematic diagram of a block 300 of flash cells 310A–310S in the array 138 according to an embodiment of the present invention. Some flash cells in the block 300 are omitted from FIG. 3 for purposes of clarity. The flash cells 310 are arranged in rows and columns. All of the flash cells 310 in a particular column have drains D connected to a common bit line BL and all of the flash cells 310 in a particular row have control gates connected to a common word line WL. The bit lines BL are identified as BL0–BLM and the word lines WL are identified as WL0–WLN. All of the flash cells 310 in the block 300 have sources S connected to a common source line SL. The remaining flash cells in the array 138 are arranged into separate blocks having separate source lines. There may be more or less flash cells 310 in the block 300, and in the array 138, according to alternate embodiments of the present invention.

The flash cells 310 are arranged in column pairs, with each flash cell 310 of the pair sharing a common source S. For example, a flash cell pair 310J and 310K have a common source S connected to the source line SL. The drains D of the flash cells 310 are connected to the bit line BL associated with the column in which the flash cells 310 are located. For example, the flash cell pair 310J and 310K have their drains D connected to a common bit line BL1.

One of the flash cells 310A–310S in the block 300 is selected according to address signals on the address lines A0–A20 that identify the flash cell. The flash cell is selected by the X-interface circuit 145 that selects a word line and by the Y-interface circuit 150 that selects a bit line in response to the address signals. The word line and the bit line are coupled to the flash cell.

A selected one of the flash cells 310A–310S in the block 300 is programmed by holding the source line SL to the ground voltage $V_{ss}$ or zero volts, coupling approximately 5–7 volts to the bit line BL connected to the flash cell, and applying a high positive voltage programming pulse of approximately 10 volts to the word line WL of the flash cell. A selected one of the flash cells 310A–310S in the block 300 is read by holding the source line SL to the ground voltage $V_{ss}$, coupling approximately 1 volt to the bit line BL connected to the flash cell, applying approximately 5.4 volts to the word line WL of the flash cell, and sensing current in the flash cell through the bit line BL. The current is sensed by one of the sense amplifiers 156 that is coupled to the bit line BL. The sensed current is inversely related to the threshold voltage of the flash cell. The higher the threshold voltage, the less current is sensed in the flash cell, and visa versa. A selected one of the flash cells 310A–310S in the block 300 may be erased by holding the source line SL to approximately 5 volts, allowing the bit line BL connected to the flash cell to float, and applying an erase pulse of approximately –10 volts to the word line WL of the flash cell. The flash cells 310A–310S in the block 300 may also be erased by holding the word lines WL0–WLN to the ground voltage $V_{ss}$, allowing the bit lines BL0–BLM to float, and applying a high positive voltage erase pulse of approximately 12 volts to the sources S through the source line SL. Charge is removed from the floating gate of the flash cell when it is erased.

Flash memory devices, and the flash cells within them, age over time and wear with use such that their structure and operational characteristics slowly change. The structure of a flash cell is changed each time it is programmed or erased, and the accumulation of cycles of programs and erasures is a significant cause of aging. Changes in the flash memory device also result from fluctuations in temperature or operating voltages. Operational parameters that are efficient in the early operating life of a flash memory device may result in less efficient operation as the flash memory device changes with age. For example, a flash cell will slow down and need longer and longer erase times as it ages. Aging of the flash cell is accelerated if it is under-erased periodically. An under-erased flash cell has too much charge on its floating gate and must be erased again. The repeated erasing of the flash cell contributes to its wear. Aging of the flash cell is also accelerated if it is over-erased one or more times during its operating life. A flash cell can be over-erased by a series of erase pulses that remove too much charge from the floating gate. An over-erased flash cell has insufficient negative charge in the floating gate, and in some cases may have a net positive charge in the floating gate, and therefore has a threshold voltage that is too low. The over-erased flash cell will be activated with a very low positive voltage applied to the control gate, even as low as a ground voltage, and may leak current even though it is not being read or verified. Leaking current is current that is allowed to pass through the flash cell when the flash cell is not intended to be active. The current from leaking flash cells makes it impossible to read other flash cells accurately if they share a bit line, the line connecting the drains of adjacent flash cells to a sense amplifier. The over-erased flash cell is corrected with a heal operation or by soft programming, and both operations take a substantial amount of time. Furthermore, each time a flash cell is over-erased the heal operation or soft programming causes additional wear on the flash cell, further altering its operating condition and making it more susceptible to being over-erased. The operating life of a flash memory device is limited by the physical changes it undergoes as it ages, and ends when the flash memory device is no longer operable due to the accumulation of such changes.

In this description, an erase pulse is a voltage applied to a control gate or a source of a flash cell to erase the flash cell. A length of the erase pulse is the period of time during which it is applied. The voltage of the erase pulse remains approximately constant for the length of the erase pulse. An erase pulse of approximately −10 volts may be applied to the control gate of the flash cell to erase the flash cell. In this method, approximately 5 volts is applied concurrently to the source, the substrate is coupled to a ground voltage reference, and the drain floats, or is electrically isolated when the erase pulse is applied to the control gate. An erase pulse of approximately 12 volts may instead be applied to the source of the flash cell to erase the flash cell. In this method, the substrate and the control gate are coupled to a ground voltage reference and the drain floats.

Methods of erasing a flash cell according to embodiments of the present invention are described herein with reference to a single flash cell, but may be applied to erase multiple flash cells in a block according to alternate embodiments of the present invention. The flash cells in a block are erased together at the same time.

Figure 4:
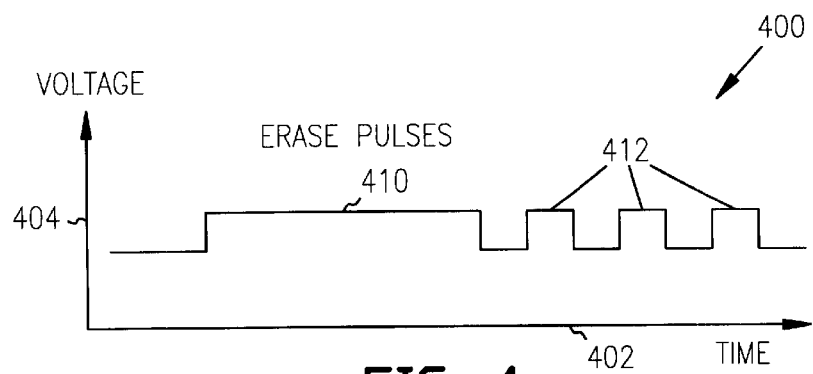
FIG. 4 is a plot of erase pulses to be applied to a flash cell to erase the flash cell according to an embodiment of the present invention.

A method of erasing a flash cell according to an embodiment of the present invention is illustrated with reference to FIG. 4 which is a plot 400 of erase pulses to be applied to a flash cell to erase the flash cell. The flash cell discussed herein is similar to the flash cell 200 described above and shown in FIG. 2. Time is shown with reference to a horizontal axis 402, and voltage is shown with reference to a vertical axis 404. The erase pulses include a long erase pulse 410 followed by several short erase pulses 412. The long erase pulse 410 removes a substantial portion of charge from the floating gate and leaves it almost or nearly erased.

The long erase pulse 410 brings the floating gate to the brink of being erased. The short erase pulses 412 are then applied to finally erase the flash cell according to a method shown in FIG. 5. The long erase pulse 410 may be 10 microseconds long, and each short erase pulse may be between 0.5 microseconds and 2.0 microseconds according to an embodiment of the present invention. The short erase pulses may all be the same length, or may vary in length according to alternate embodiments of the present invention.

Figure 5:
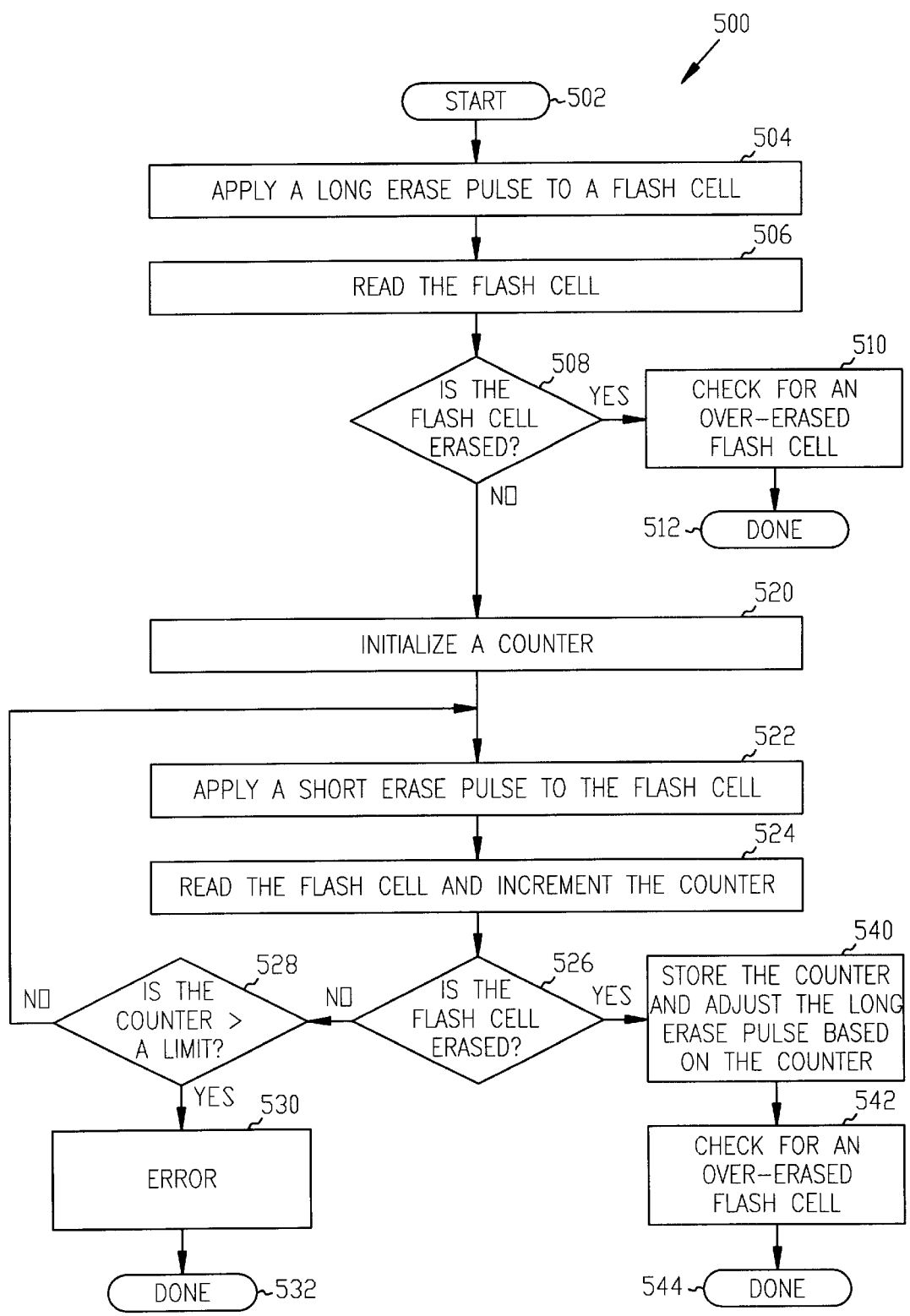
FIG. 5 is a flowchart of a method of erasing a flash cell according to an embodiment of the present invention.

A flowchart of a method 500 of erasing a flash cell is shown in FIG. 5 according to an embodiment of the present invention. The method 500 starts in 502 and a long erase pulse is applied to the flash cell in 504. The flash cell is read in 506 and the method 500 determines in 508 if the flash cell is erased based on the read in 506. If the flash cell is erased, the method 500 determines whether the flash cell is over-erased in 510 before ending in 512. If it is determined in 508 that the flash cell is not erased, a counter is initialized in 520 and a short erase pulse is applied to the flash cell in 522. The flash cell is read and the counter is incremented in 524. The method 500 determines in 526 if the flash cell is erased based on the read in 524. If the flash cell is not erased, the method 500 determines in 528 whether the counter has exceeded a limit, and if so, an error is indicated in 530 indicating that the flash cell is defective, and the method ends in 532. If the counter has not exceeded the limit in 528, the method 500 returns to 522 to apply another short erase pulse to the flash cell. The method 500 repeats the loop of 522–528 and returns to 522 to apply short erase pulses to the flash cell until the flash cell is shown to be erased by the read in 524, or the counter exceeds the limit in 528. Once the flash cell is shown to be erased in 526, the method stores the value of the counter in a memory such as a register and adjusts the long erase pulse in 540 based on the counter, or more specifically the value of the counter indicating how many short erase pulses have been applied to the flash cell. The method 500 determines whether the flash cell is over-erased in 542 before ending in 544.

Figure 6:
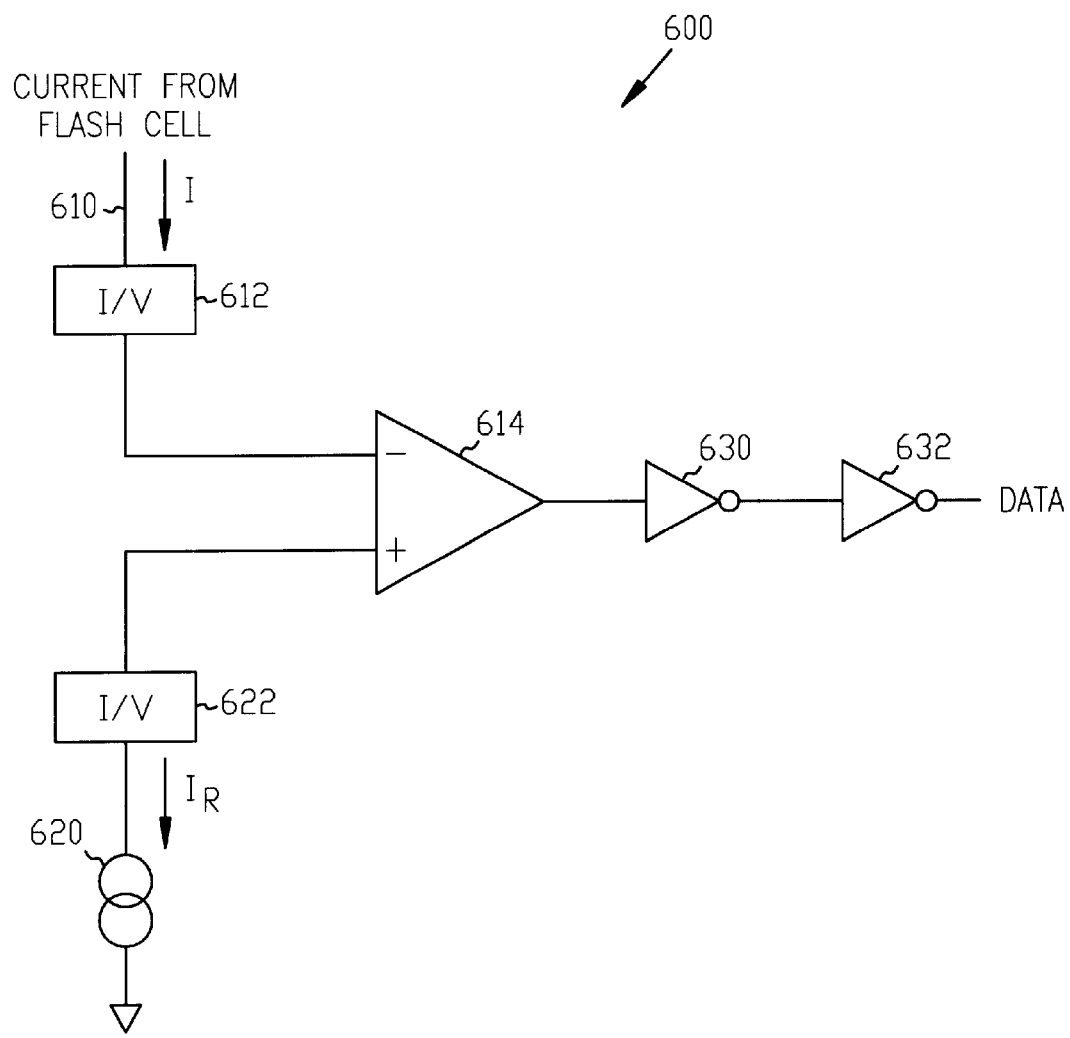
FIG. 6 is an electrical schematic diagram of a read circuit for reading flash cells according to an embodiment of the present invention.

The flash cell is read in 506 and 524 with a read circuit 600 shown in FIG. 6 according to an embodiment of the present invention. The read circuit 600 is located in the IC 110, and may be in the sense amplifiers 156 shown in FIG. 1. The flash cell is selected according to address signals on the address lines A0–A20, and is read by applying approximately 5.4 volts to its control gate and sensing a current I in the flash cell. The current I from the flash cell is received on a line 610 and is converted to a voltage signal, also called a read signal, by a first current to voltage conversion circuit 612. The first current to voltage conversion circuit 612 generates a low read signal if the current I is high, and a high read signal if the current I is low. The read signal is coupled to an inverting input of a sense amplifier 614. The sense amplifier 614 is a comparator in this embodiment of the present invention. A reference current $I_R$ is generated in a current source 620 to be approximately equal to current in the flash cell if it had a threshold voltage of 4.0 volts. In one embodiment of the present invention, $I_R$ is 30 microamps. $I_R$ is converted into a reference signal by a second current to voltage conversion circuit 622 that is coupled to a non-inverting input of the sense amplifier 614. The read signal is compared with the reference signal in the sense amplifier 614 to generate a data signal at an output of the sense amplifier 614. The data signal is inverted by a first inverter 630, and inverted again by a second inverter 632 to output a data signal to the IC 110 indicating whether the flash cell is programmed or erased. Multi-state flash cells having multiple distinct threshold voltage levels may be read by read circuits having more than one sense amplifier according to alternate embodiments of the present invention.

In methods of erasing a flash cell described hereinbelow according to embodiments of the present invention, a flash cell is erased with the long erase pulse 410 followed by several of the short erase pulses 412 shown in FIG. 4. The long erase pulse 410 removes a substantial portion of charge from a floating gate in the flash cell and leaves it almost or nearly erased. The short erase pulses 412 finally erase the flash cell. The number of short erase pulses 412 applied in an erase of the flash cell is remembered by storing a count in a memory, and a count may be stored each time the flash cell is erased to generate a historical record of the erases of the flash cell. The length of a subsequent long erase pulse 410 is adjusted based on the counts of short erase pulses 412 applied during one or more of the previous erases of the flash cell. The long erase pulse 410 is lengthened if too many short erase pulses 412 have been applied in the past, and the long erase pulse 410 is shortened if too few short erase pulses 412 have been applied in the past. The length of the long erase pulse 410 is variable and is adjusted such that it leaves the flash cell almost or nearly erased, or brings the flash cell to the brink of being erased, each time it is applied during the operating life of the flash cell. The long erase pulse 410 produces a nearly-erased state in the flash cell consistently even as the flash cell changes physically with age. The number of short erase pulses 412 needed to complete the erasing of a flash cell remains within a specified range during the operating life of the flash cell.

Figure 7:
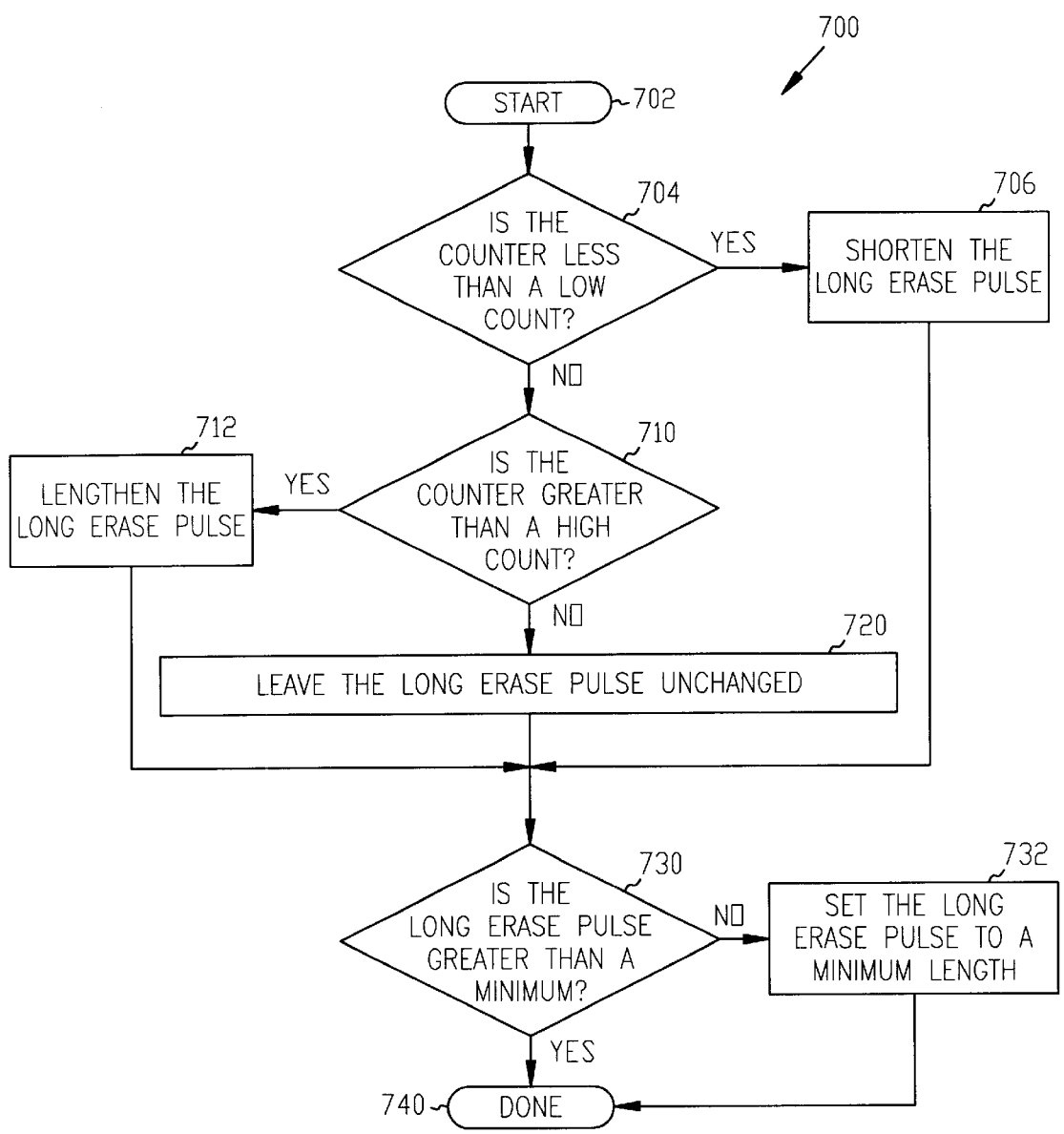
FIG. 7 is a flowchart of a method of adjusting a long erase pulse according to an embodiment of the present invention.

The adjustment of the long erase pulse in 540 may be accomplished with a method 700 shown in FIG. 7 according to an embodiment of the present invention. The method 700 starts in 702 and determines in 704 whether the counter is less than a low count. The low count may be 3 according to an embodiment of the present invention. If the counter is less than the low count, the long erase pulse is shortened in 706. The long erase pulse may be shortened by 1 microsecond in 706 according to an embodiment of the present invention. If the counter is not less than the low count, the method 700 determines in 710 whether the counter is greater than a high count. The high count may be 6 according to an embodiment of the present invention. If the counter is greater than the high count, the long erase pulse is lengthened in 712. The long erase pulse may be lengthened by 1 microsecond in 712 according to an embodiment of the present invention. If the counter is not greater than the high count the method 700 leaves the long erase pulse unchanged in 720, and all three branches of the method 700 meet thereafter when the method 700 determines if the long erase pulse is greater than a minimum in 730. If the long erase pulse is not greater than the minimum, it is set to a minimum length in 732 before the method 700 is done in 740. The long erase pulse may be set to a minimum length in 732 by adding a variable pulse length that is determined based on the counter to a minimum value according to an embodiment of the present invention. The long erase pulse may also be set to an initial length before the method 700 starts in 702.

Figure 8:
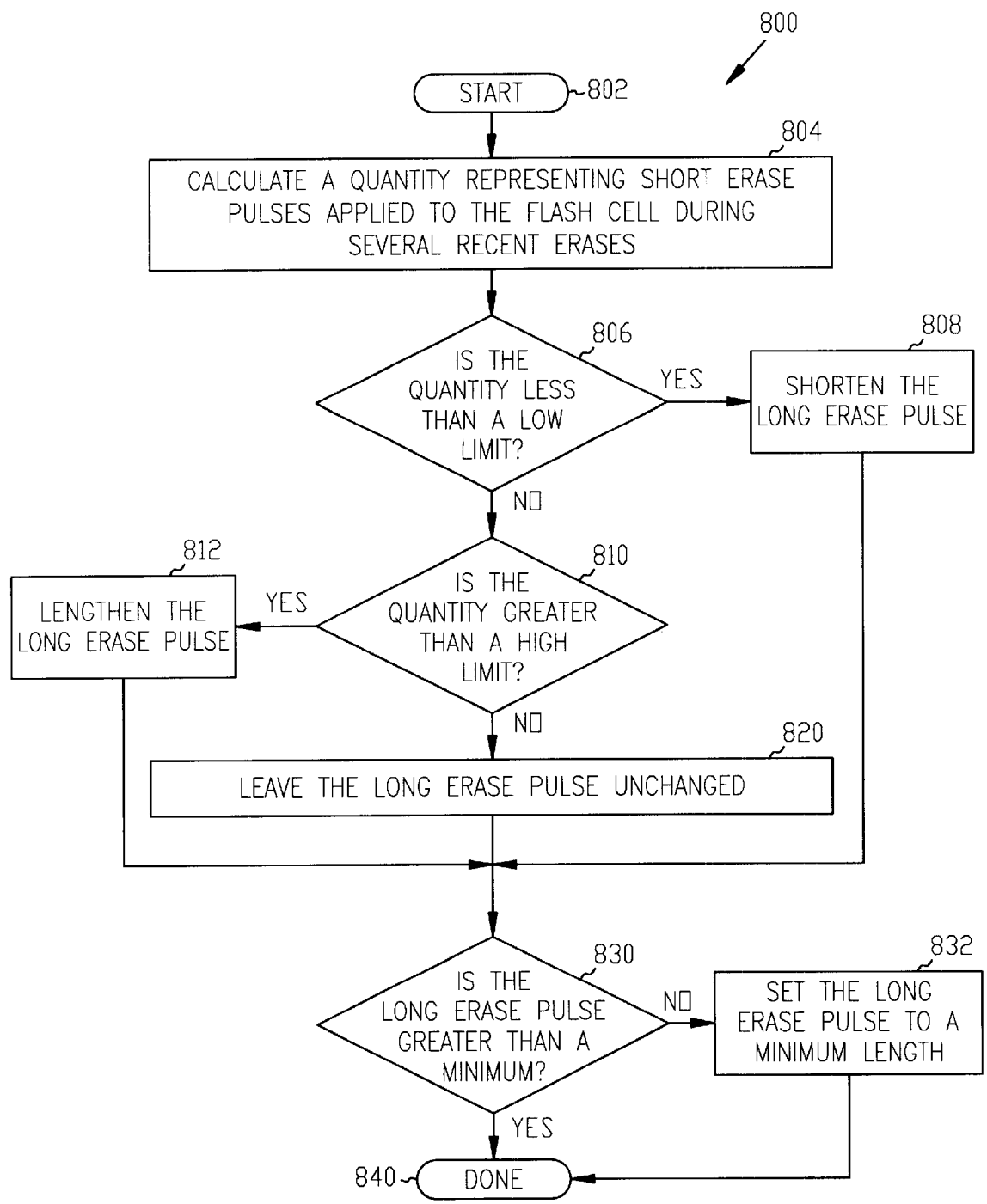
FIG. 8 is a flowchart of a method of adjusting a long erase pulse according to an embodiment of the present invention.

The adjustment of the long erase pulse in 540 may be accomplished with a method 800 shown in FIG. 8 according to another embodiment of the present invention. The method 800 starts in 802 and calculates a quantity representing short erase pulses applied to the flash cell during several recent erases in 804. The calculation of the quantity may be done in many ways as will be described hereinbelow. The method 800 determines in 806 whether the quantity is less than a low limit. If the quantity is less than the low limit, the long erase pulse is shortened in 808. The long erase pulse may be shortened by one (1) microsecond in 808 according to an embodiment of the present invention. If the quantity is not less than the low limit, the method 800 determines in 810 whether the quantity is greater than a high limit. If the quantity is greater than the high limit, the long erase pulse is lengthened in 812. The long erase pulse may be lengthened by one (1) microsecond in 812 according to an embodiment of the present invention. If the quantity is not greater than the high limit the method 800 leaves the long erase pulse unchanged in 820, and all three branches of the method 800 meet thereafter when the method 800 determines if the long erase pulse is greater than a minimum in 830. If the long erase pulse is not greater than the minimum, it is set to a minimum length in 832 before the method 800 is done in 840. The long erase pulse may be set to a minimum length in 832 by adding a variable pulse length that is determined based on the quantity to a minimum value according to an embodiment of the present invention. The long erase pulse may also be set to an initial length before the method 800 starts in 802.

The calculation of the quantity representing short erase pulses applied to the flash cell during several recent erases in 804 may be calculated in several ways according to alternate embodiments of the present invention. For example, the quantity may be calculated by adding a past average of short erase pulses applied to the flash cell prior to the long erase pulse to the counted number of short erase pulses to equal a sum and calculating the quantity as being equal to the sum divided by two. The length of the long erase pulse may be increased if the quantity is more than six (6), and the length of the long erase pulse may be decreased if the quantity of short erase pulses is less than three (3). The quantity is an average of short erase pulses applied to the flash cell each time the flash cell is erased, and the average is weighted toward the most recent erase of the flash cell. Equation (1) expresses the calculation where the quantity is represented by Q, the past average is represented by PA, and the counter is represented by K:

$$Q=(PA+K)/2 \qquad (1)$$

The quantity Q then becomes the past average PA for the next erase according to equation (2):

$$PA=Q \qquad (2)$$

Figure 9:
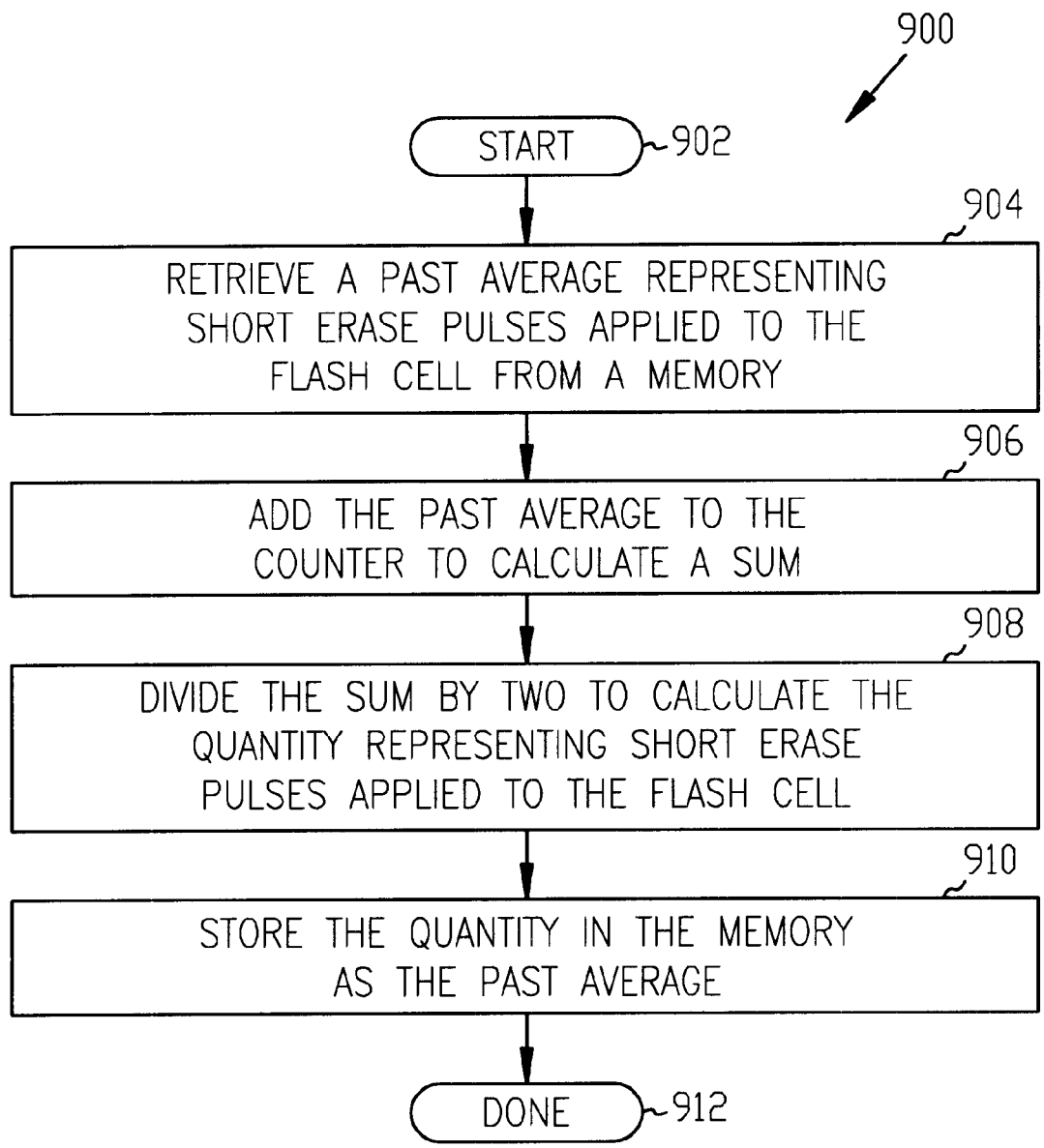
FIG. 9 is a flowchart of a method of calculating a quantity to adjust a long erase pulse according to an embodiment of the present invention.

The quantity may be calculated with a method 900 shown in FIG. 9 according to an embodiment of the present invention. The method 900 starts in 902 and retrieves a past average from a memory in 904. The past average represents an average of short erase pulses applied in past erases of the flash cell. The past average is added to the counter in 906 to calculate a sum. The counter was incremented in 524 of the method 500. The sum is divided by two (2) in 908 to calculate the quantity, and the quantity is stored as the past average in the memory in 910 before the method 900 is done in 912.

The calculation of the quantity representing short erase pulses applied to the flash cell during several recent erases in 804 may also be calculated in the following manner according to an embodiment of the present invention. The quantity may be calculated by calculating a sum of short erase pulses applied to the flash cell during eight consecutive erases of the flash cell completed prior to the long erase pulse, and calculating an average by dividing the sum by eight. The quantity is then set equal to the sum added to the counted number of short erase pulses, and the average is then subtracted from the quantity to leave the result. The length of the long erase pulse may be increased if the quantity is more than forty eight (48), and the length of the long erase pulse may be decreased if the quantity is less than twenty four (24). The quantity is an average of short erase pulses applied to the flash cell over eight (8) erases, and the short erase pulses applied during more recent erases are weighted more heavily. Equations (3), (4), and (5) express the calculation where the quantity is represented by Q, the sum is represented by SUM, the average is represented by A, an erase event is represented by i, the most recent erase is represented by n, and the counter is represented by K:

$$SUM = \sum_{i=n-8}^{n-1} K_i \qquad (3)$$

$$A = SUM/8 \qquad (4)$$

$$Q = SUM + K - A \qquad (5)$$

Figure 10:
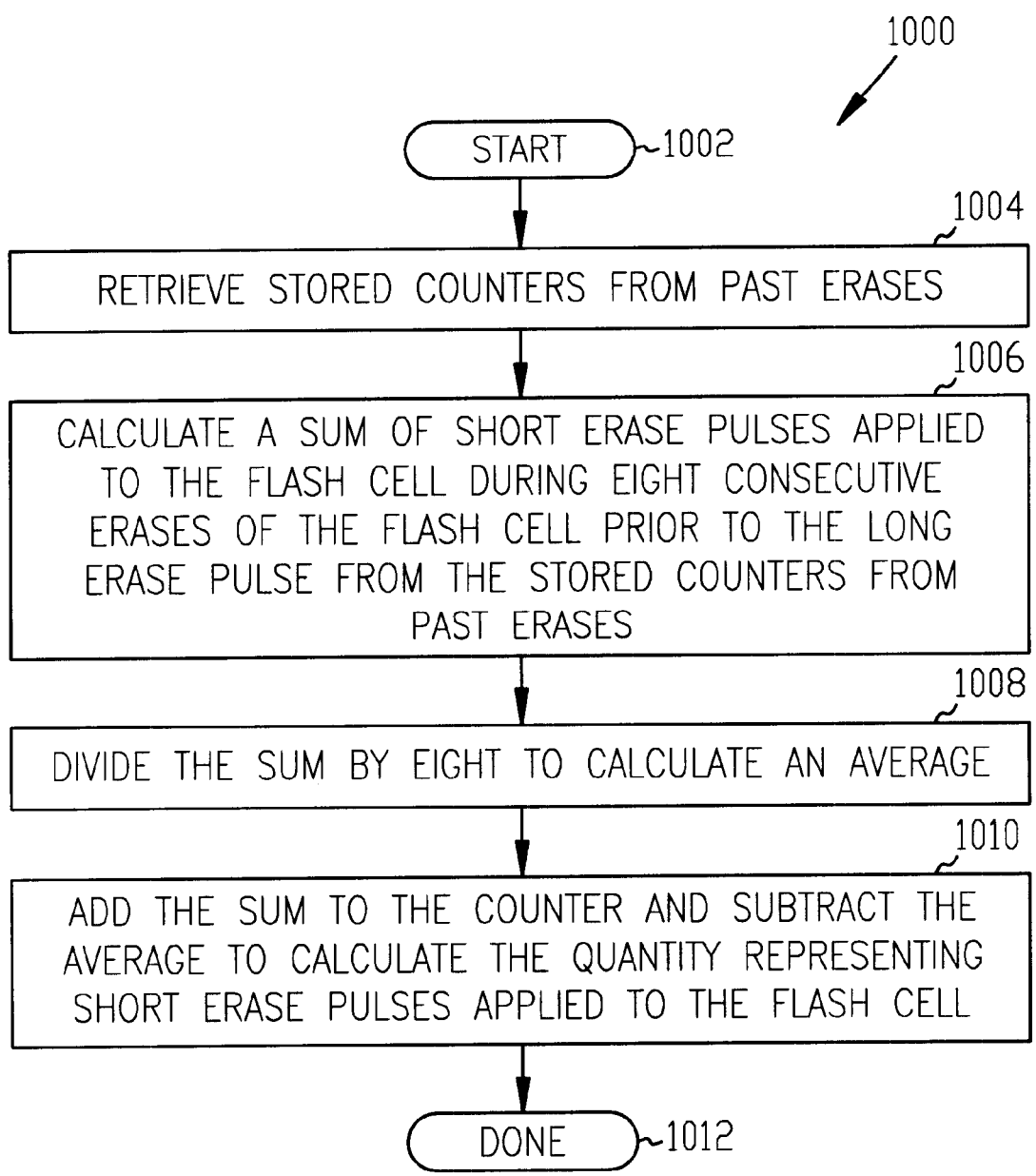
FIG. 10 is a flowchart of a method of calculating a quantity to adjust a long erase pulse according to an embodiment of the present invention.

The quantity may be calculated with a method 1000 shown in FIG. 10 according to an embodiment of the present invention. The method 1000 starts in 1002 and retrieves stored counters from past erases from a memory in 1004. A sum of short erase pulses applied to the flash cell during eight consecutive erases of the flash cell completed prior to the long erase pulse is calculated from the stored counters in 1006. The sum is divided by eight (8) in 1008 to calculate an average. The quantity is then calculated in 1010 by adding the sum to the counter that was incremented in 524 of the method 500, and then subtracting the average. The method 1000 is done in 1012.

The calculation of the quantity representing short erase pulses applied to the flash cell during several recent erases in 804 may also be calculated in the following manner according to an embodiment of the present invention. The quantity may be calculated by calculating a sum of short erase pulses applied to the flash cell during nine consecutive erases of the flash cell including the most recent erase, and calculating an average by dividing the sum by nine. The quantity is then calculated by subtracting the average from the sum. The length of the long erase pulse may be increased if the quantity is more than forty eight (48), and the length of the long erase pulse may be decreased if the quantity is less than twenty four (24). The quantity is an average of short erase pulses applied to the flash cell over eight (8) erases, and the short erase pulses applied during more recent erases are weighted more heavily. Equations (6), (7), and (8) express the calculation where the quantity is represented by Q, the sum is represented by SUM, the average is represented by A, an erase event is represented by i, the most recent erase is represented by n, and the counter is represented by K:

$$SUM = \sum_{i=n-8}^{n} K_i \qquad (6)$$

$$A = SUM/9 \qquad (7)$$

$$Q = SUM - A \qquad (8)$$

Figure 11:
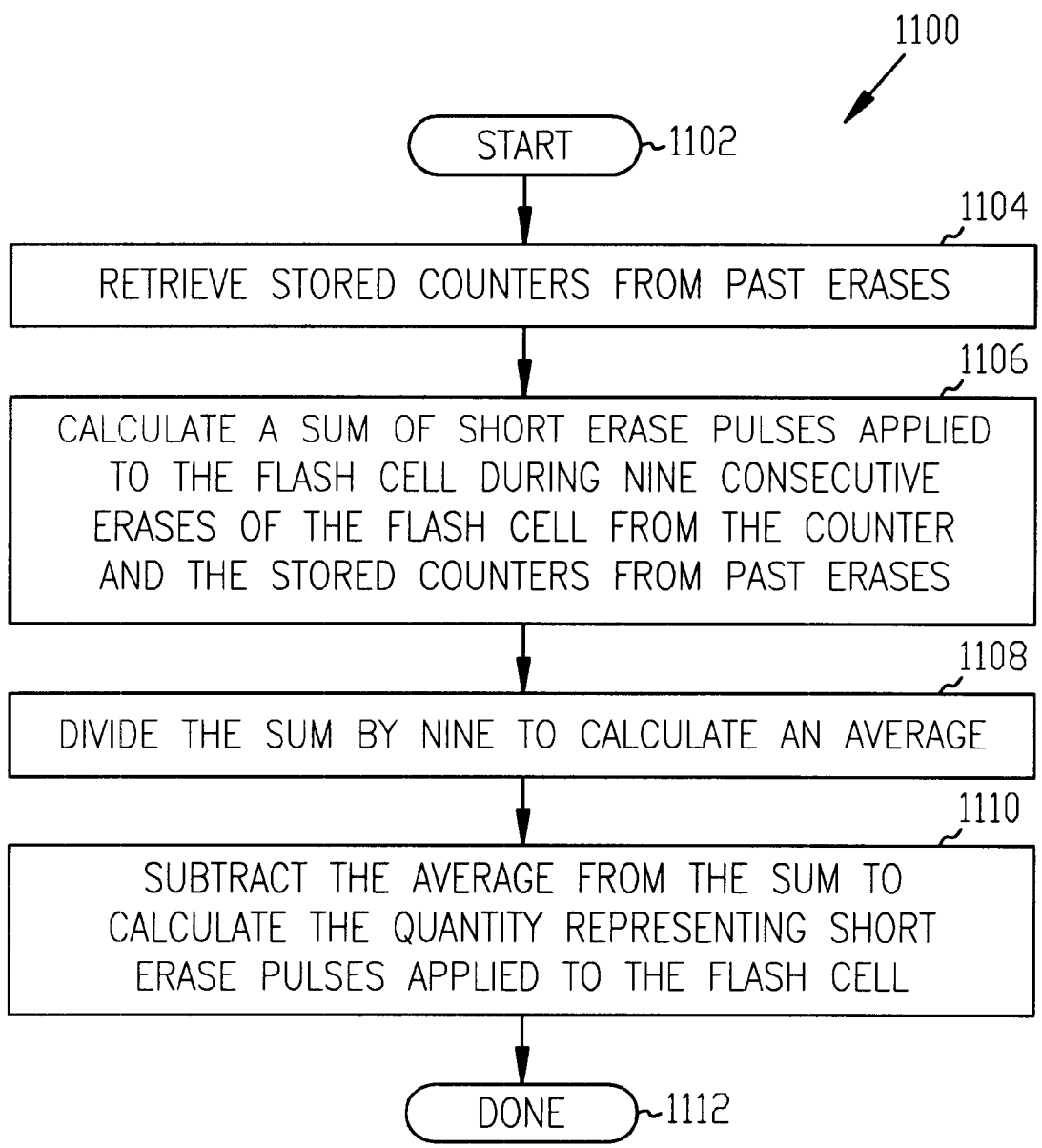
FIG. 11 is a flowchart of a method of calculating a quantity to adjust a long erase pulse according to an embodiment of the present invention.

The quantity may be calculated with a method 1100 shown in FIG. 11 according to an embodiment of the present invention. The method 1100 starts in 1102 and retrieves stored counters from past erases from a memory in 1104. A sum of short erase pulses applied to the flash cell during nine consecutive erases of the flash cell is calculated from the counter and the stored counters in 1106. The counter had been incremented in 524 of the method 500. The sum is divided by nine (9) in 1108 to calculate an average. The quantity is then calculated in 1110 by subtracting the average from the sum and the method 1100 is done in 1112.

The quantity representing short erase pulses applied to the flash cell during several recent erases calculated as described above and shown with the methods 900, 1000, and 1100 shown in FIGS. 9, 10, and 11 is calculated to change the length of the long erase pulse based on the historical trend of all past erases of a flash cell. Recent erases of the flash cell are weighted more heavily than older erases in the calculation of the quantity. The use of the quantity dampens changes in the long erase pulse over time as compared with a calculation based only on the last erase of the flash cell.

The methods 500, 700, 800, 900, 1000, and 1100 of erasing a flash cell according to embodiments of the present invention were described herein with reference to a single flash cell, but may be applied to erase multiple flash cells in a block according to alternate embodiments of the present invention. The flash cells in a block are erased together at the same time.

In the methods 500, 700, 800, 900, 1000, and 1100 of erasing a flash cell described hereinabove according to embodiments of the present invention, the length of a long erase pulse 410 applied to erase a flash cell is adjusted based on one or more counts of short erase pulses 412 applied during previous erases of the flash cell. The long erase pulse 410 was lengthened if too many short erase pulses 412 had been applied in the past, and the long erase pulse 410 was shortened if too few short erase pulses 412 had been applied in the past. The length of the long erase pulse 410 is variable and is adjusted such that it leaves the flash cell almost or nearly erased, or brings the flash cell to the brink of being erased, each time it is applied during the operating life of the flash cell. The long erase pulse 410 produces a nearly-erased state in the flash cell consistently even as the flash cell changes physically with age. The number of short erase pulses 412 needed to complete the erasing of a flash cell remained within a specified range during the operating life of the flash cell.

The methods 500, 700, 800, 900, 1000, and 1100 described above have several advantages in the erasure of a flash cell or a block of flash cells. The capability of the long erase pulse 410 to produce a nearly-erased state in the flash cell consistently reduces the number of times that an erase pulse is applied to the flash cell, and reduces the the number of times that the flash cell will be read to determine if it is erased. This reduces wear on the flash cell and slows its aging process such that it may have a longer operating life. Also, the use of short erase pulses 412 to gently nudge the flash cell into an erased state reduces the number and frequency of over-erased flash cells because the flash cells are less likely to be pushed into an over-erased state by a single short erase pulse 412. This reduces the number of heal operations, or the soft programming, used to correct over-erased flash cells, and this reduces wear on the flash cell. Also, the methods 500, 700, 800, 900, 1000, and 1100 reduce the time needed to erase one or more flash cells because they reduce the number of times that a flash cell will be read to determine if it is erased, and they reduce the frequency with which the flash cell will be subject to a heal operation or soft programming.

The methods 500, 700, 800, 900, 1000, or 1100 may be implemented as a series of programmable instructions stored and implemented in the controller 105. The methods 500, 700, 800, 900, 1000, or 1100 may also be implemented in the state machine 130. The state machine 130 is a sequential logic circuit including both logic gates and storage elements designed to implement algorithms directly in hardware. The state machine 130 may include logic gates and storage elements to carry out each act of the methods 500, 700, 800, 900, 1000, or 1100. Other portions of the IC 110 may also be used to implement the methods 500, 700, 800, 900, 1000, or 1100. For example, the pump circuit 160 may be used to provide any voltages needed to program, erase, or read the flash cell. The flash cell may be read by a sense amplifier in the sense amplifiers 156, and the read data may be stored in the input data latch 119. The methods 500, 700, 800, 900, 1000, or 1100 may be implemented in other ways known to those skilled in the art.

Figure 12:
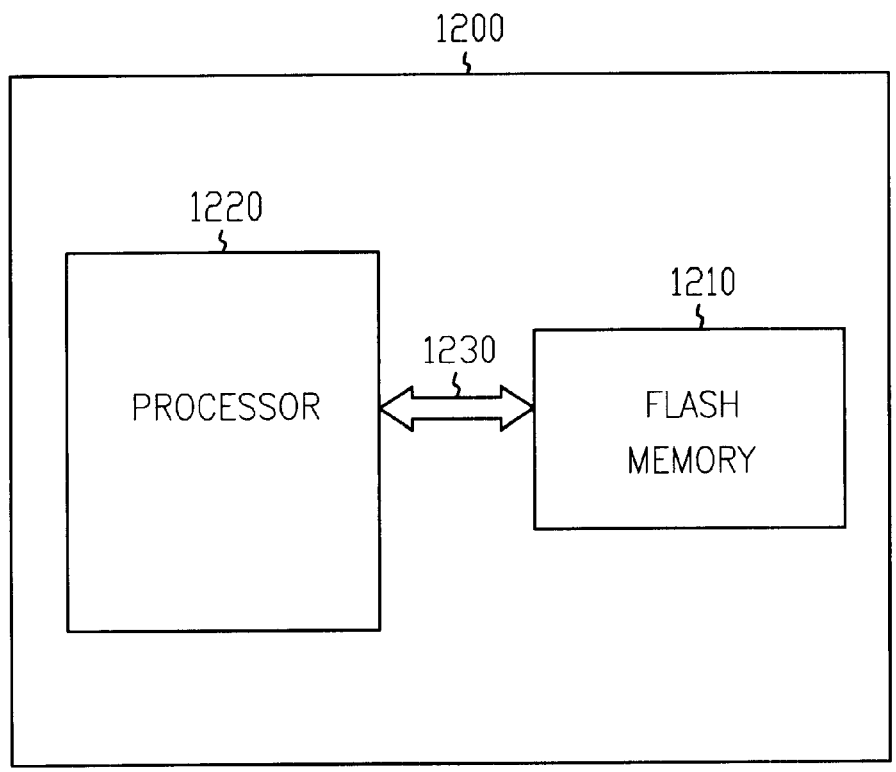
FIG. 12 is a block diagram of an integrated circuit chip according to an embodiment of the present invention.

An integrated circuit chip 1200 according to an embodiment of the present invention is shown in FIG. 12. The chip 1200 includes an embedded flash memory 1210 such as the flash memory integrated circuit (IC) 110. The embedded flash memory 1210 includes elements or instructions to implement the methods 500, 700, 800, 900, 1000, or 1100 shown in FIGS. 5, 7, 8, 9, 10, and 11 and described above according to the embodiments of the present invention. The embedded flash memory 1210 shares the chip 1200 with another integrated circuit 1220 such as a processor, or possibly several other integrated circuits. The embedded flash memory 1210 and the integrated circuit 1220 are coupled together by a suitable communication line or bus 1230.

Figure 13:
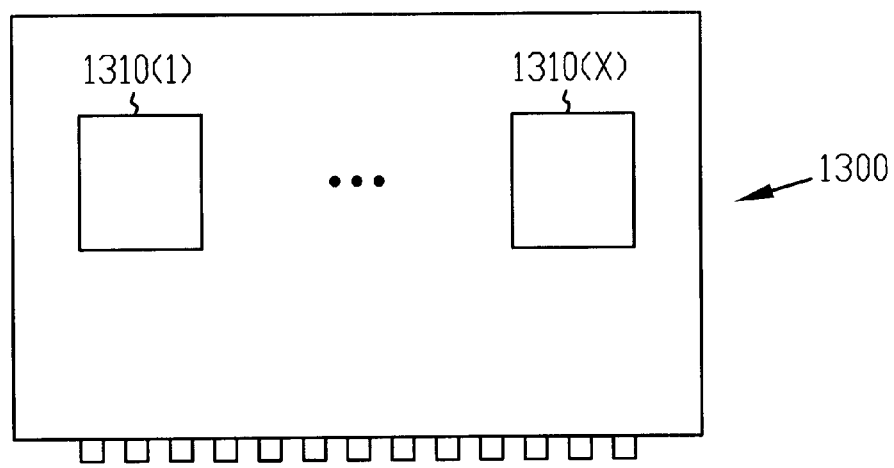
FIG. 13 is block diagram of a flash memory card according to an embodiment of the present invention.

One skilled in the art having the benefit of this description will understand that more than one flash memory integrated circuit (IC) 110 according to the embodiments of the present invention described above may be included in various package configurations. For example, a flash memory card 1300 according to an embodiment of the present invention is shown in FIG. 13. The card 1300 includes a plurality of flash memory integrated circuits 1310(1)–1310(X) each of which are similar to the flash memory integrated circuit (IC) 110 shown in FIG. 1. The card 1300 may be a single integrated circuit in which the flash memory integrated circuits 1310(1)–1310(X) are embedded.

Figure 14:
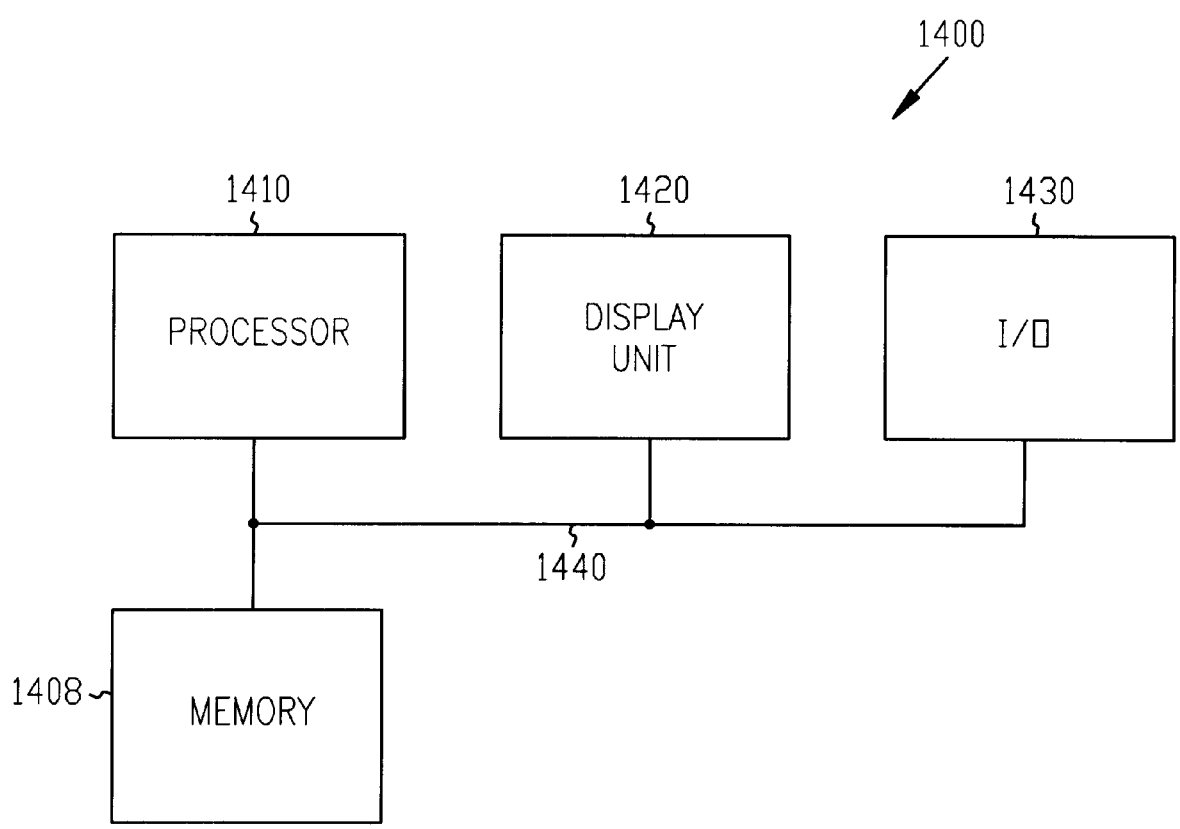
FIG. 14 is a block diagram of an information-handling system according to an embodiment of the present invention.

FIG. 14 is a block diagram of an information-handling system 1400 according to an embodiment of the present invention. The information-handling system 1400 includes a memory system 1408, a processor 1410, a display unit 1420, and an input/output (I/O) subsystem 1430. The processor 1410 may be, for example, a microprocessor. The memory system 1408 is comprised of the flash memory integrated circuit (IC) 110. The memory system 1408 includes elements or instructions to implement the methods 500, 700, 800, 900, 1000, or 1100 shown in FIGS. 5, 7, 8, 9, 10, and 11 and described above according to the embodiments of the present invention. The I/O subsystem 1430 may be a keyboard or other device to allow the user to communicate with the system 1400. The processor 1410 and the memory system 1408 may be embedded on a single integrated circuit chip such as the chip 1200 shown in FIG. 12. The processor 1410, the display unit 1420, the I/O subsystem 1430, and the memory system 1408 are coupled together by a suitable communication line or bus 1440.

In various embodiments of the present invention, the information-handling system 1400 is a computer system (such as, for example, a video game, a hand-held calculator, a television set-top box, a fixed-screen telephone, a network computer (NC), a hand-held computer, a personal computer, or a multiprocessor supercomputer), an information appliance (such as, for example, a cellular telephone, a smart mobile phone, a pager, a daily planner or organizer, a personal digital assistant (PDA), or any wireless device), an information component (such as, for example, a magnetic disk drive or telecommunications modem), or other appliance (such as, for example, a television, a hearing aid, washing machine or microwave oven having an electronic controller).

Although specific embodiments have been illustrated and described herein, it will be appreciated by those skilled in the art having the benefit of this description that any equivalent arrangement may be substituted for the specific embodiments shown. The present invention is therefore limited only by the claims and equivalents thereof.

What is claimed is:

1. A method of operating a flash memory device comprising:

selecting a flash cell in a flash memory device to undergo an erase;

applying a long erase pulse to the flash cell;

reading the flash cell;

for each time the flash cell is read and is not in an erased state:

applying a short erase pulse to the flash cell;

counting the short erase pulse; and reading the flash cell; and adjusting a length of the long erase pulse based on the counted number of short erase pulses that were applied to the flash cell.

2. The method of claim 1 wherein adjusting a length comprises:

increasing a length of the long erase pulse if the counted number of short erase pulses is more than a high number of pulses; and decreasing the length of the long erase pulse if the counted number of short erase pulses is less than a low number of pulses.

3. The method of claim 1 wherein adjusting a length comprises:

calculating a quantity representing short erase pulses applied to the flash cell over a selected number of prior erases of the flash cell and the erase of the flash cell including the counted number of short erase pulses;

increasing a length of the long erase pulse if the quantity is more than a high limit; and decreasing the length of the long erase pulse if the quantity is less than a low limit.

4. The method of claim 1 wherein adjusting a length comprises:

adding a past average of short erase pulses applied to the flash cell prior to the application of the long erase pulse to the counted number of short erase pulses to equal a sum;

calculating a quantity representing short erase pulses applied to the flash cell as being equal to the sum divided by two;

increasing a length of the long erase pulse if the quantity is more than six;

decreasing the length of the long erase pulse if the quantity is less than three; and wherein the past average is calculated in the same manner as the quantity for an immediately preceding erase of the flash cell.

5. The method of claim 1 wherein adjusting a length comprises:

calculating a sum of short erase pulses applied to the flash cell by counting a number of short erase pulses applied to the flash cell during eight consecutive erases of the flash cell completed prior to the application of the long erase pulse;

calculating an average by dividing the sum by eight;

calculating a quantity representing short erase pulses applied to the flash cell as being equal to the sum added to the counted number of short erase pulses less the average;

increasing a length of the long erase pulse if the quantity is more than forty eight; and decreasing the length of the long erase pulse if the quantity is less than twenty four.

6. The method of claim 1 wherein adjusting a length comprises:

calculating a sum of short erase pulses applied to the flash cell by counting a number of short erase pulses applied to the flash cell during nine consecutive erases of the flash cell completed during and prior to the erase of the flash cell including the counted number of short erase pulses;

calculating an average by dividing the sum by nine;

calculating a quantity representing short erase pulses applied to the flash cell by subtracting the average from the sum;

increasing a length of the long erase pulse if the quantity is more than forty eight; and decreasing the length of the long erase pulse if the quantity is less than twenty four.

7. The method of claim 1 wherein:

selecting a flash cell comprises selecting a block of flash cells in a flash memory device to undergo an erase; and further comprising ending the method if the counted number of short erase pulses exceeds an error limit.

8. The method of claim 1 wherein reading the flash cell comprises:

selecting the flash cell by selecting a word line and a bit line coupled to the flash cell in response to address signals;

applying approximately 5.4 volts to a control gate of the flash cell and sensing a read current in the flash cell;

converting the read current into a read signal in a first current to voltage conversion circuit;

generating a reference current in a current source to be approximately equal to current in a flash cell with a threshold voltage of 4.0 volts;

converting the reference current into a reference signal in a second current to voltage conversion circuit; and comparing the read signal with the reference signal in a comparator to generate a data signal indicating whether the flash cell is programmed or erased.

9. A method of operating a system comprising:

exchanging signals between a memory controller and a flash memory device;

selecting a flash cell in the flash memory device to undergo an erase based on the signals;

applying a long erase pulse to the flash cell;

reading the flash cell;

for each time the flash cell is read and is not in an erased state:
 applying a short erase pulse to the flash cell;
 counting the short erase pulse; and reading the flash cell; and adjusting a length of the long erase pulse based on the counted number of short erase pulses that were applied to the flash cell.

10. The method of claim 9 wherein adjusting a length comprises:

increasing a length of the long erase pulse if the counted number of short erase pulses is more than a high number of pulses; and decreasing the length of the long erase pulse if the counted number of short erase pulses is less than a low number of pulses.

11. The method of claim 9 wherein adjusting a length comprises:

calculating a quantity representing short erase pulses applied to the flash cell over a selected number of prior erases of the flash cell and the erase of the flash cell including the counted number of short erase pulses;

increasing a length of the long erase pulse if the quantity is more than a high limit; and decreasing the length of the long erase pulse if the quantity is less than a low limit.

12. The method of claim 9 wherein adjusting a length comprises:

adding a past average of short erase pulses applied to the flash cell prior to the application of the long erase pulse to the counted number of short erase pulses to equal a sum;

calculating a quantity representing short erase pulses applied to the flash cell as being equal to the sum divided by two;

increasing a length of the long erase pulse if the quantity is more than six;

decreasing the length of the long erase pulse if the quantity is less than three; and wherein the past average is calculated in the same manner as the quantity for an immediately preceding erase of the flash cell.

13. The method of claim 9 wherein adjusting a length comprises:

calculating a sum of short erase pulses applied to the flash cell by counting a number of short erase pulses applied to the flash cell during eight consecutive erases of the flash cell completed prior to the application of the long erase pulse;

calculating an average by dividing the sum by eight;

calculating a quantity representing short erase pulses applied to the flash cell as being equal to the sum added to the counted number of short erase pulses less the average;

increasing a length of the long erase pulse if the quantity is more than forty eight; and decreasing the length of the long erase pulse if the quantity is less than twenty four.

14. The method of claim 9 wherein adjusting a length comprises:

calculating a sum of short erase pulses applied to the flash cell by counting a number of short erase pulses applied to the flash cell during nine consecutive erases of the flash cell completed during and prior to the erase of the flash cell including the counted number of short erase pulses;

calculating an average by dividing the sum by nine;

calculating a quantity representing short erase pulses applied to the flash cell by subtracting the average from the sum;

increasing a length of the long erase pulse if the quantity is more than forty eight; and decreasing the length of the long erase pulse if the quantity is less than twenty four.

15. The method of claim 9 wherein:

selecting a flash cell comprises selecting a block of flash cells in a flash memory device to undergo an erase; and further comprising ending the method if the counted number of short erase pulses exceeds an error limit.

16. The method of claim 9 wherein reading the flash cell comprises:

selecting the flash cell by selecting a word line and a bit line coupled to the flash cell in response to address signals;

applying approximately 5.4 volts to a control gate of the flash cell and sensing a read current in the flash cell;

converting the read current into a read signal in a first current to voltage conversion circuit;

generating a reference current in a current source to be approximately equal to current in a flash cell with a threshold voltage of 4.0 volts;

converting the reference current into a reference signal in a second current to voltage conversion circuit; and comparing the read signal with the reference signal in a comparator to generate a data signal indicating whether the flash cell is programmed or erased.

17. The method of claim 9 wherein exchanging signals further comprises exchanging signals between a processor or a microprocessor and the flash memory device embedded in a single integrated circuit chip.

18. The method of claim 9 wherein:

exchanging signals further comprises exchanging address signals, data signals, a chip enable signal, a write enable signal, a reset/power-down signal, an output enable signal, a write protect signal, and a status signal between a processor and the flash memory device over a bus; and exchanging signals between the processor, the flash memory device, a display unit, and an input/output subsystem over the bus.

19. A flash memory device comprising:

an address circuit to select a flash cell in a flash memory device to undergo an erase; and a control circuit comprising elements to:
apply a long erase pulse to the flash cell;
read the flash cell;
for each time the flash cell is read and is not in an erased state:
apply a short erase pulse to the flash cell;
count the short erase pulse; and
read the flash cell; and
adjust a length of the long erase pulse based on the counted number of short erase pulses that were applied to the flash cell.

20. The flash memory device of claim 19 wherein the flash memory device is an integrated circuit embedded with another integrated circuit in an integrated circuit chip.

21. The flash memory device of claim 19 wherein the control circuit comprises a state machine or a processor or a microprocessor.

22. The flash memory device of claim 19 wherein the control circuit further comprises elements to:

increase a length of the long erase pulse if the counted number of short erase pulses is more than a high number of pulses; and decrease the length of the long erase pulse if the counted number of short erase pulses is less than a low number of pulses.

23. The flash memory device of claim 19 wherein the control circuit further comprises elements to:

calculate a quantity representing short erase pulses applied to the flash cell over a selected number of prior erases of the flash cell and the erase of the flash cell including the counted number of short erase pulses;

increase a length of the long erase pulse if the quantity is more than a high limit; and decrease the length of the long erase pulse if the quantity is less than a low limit.

24. The flash memory device of claim 19 wherein the control circuit further comprises elements to:

add a past average of short erase pulses applied to the flash cell prior to the application of the long erase pulse to the counted number of short erase pulses to equal a sum;

calculate a quantity representing short erase pulses applied to the flash cell as being equal to the sum divided by two;

increase a length of the long erase pulse if the quantity is more than six;

decrease the length of the long erase pulse if the quantity is less than three; and calculate the past average in the same manner as the quantity for an immediately preceding erase of the flash cell.

25. The flash memory device of claim 19 wherein the control circuit further comprises elements to:

calculate a sum of short erase pulses applied to the flash cell by counting a number of short erase pulses applied to the flash cell during eight consecutive erases of the flash cell completed prior to the application of the long erase pulse;

calculate an average by dividing the sum by eight;

calculate a quantity representing short erase pulses applied to the flash cell as being equal to the sum added to the counted number of short erase pulses less the average;

increase a length of the long erase pulse if the quantity is more than forty eight; and decrease the length of the long erase pulse if the quantity is less than twenty four.

26. The flash memory device of claim 19 wherein the control circuit further comprises elements to:

calculate a sum of short erase pulses applied to the flash cell by counting a number of short erase pulses applied to the flash cell during nine consecutive erases of the flash cell completed during and prior to the erase of the flash cell including the counted number of short erase pulses;

calculate an average by dividing the sum by nine;

calculate a quantity representing short erase pulses applied to the flash cell by subtracting the average from the sum;

increase a length of the long erase pulse if the quantity is more than forty eight; and decrease the length of the long erase pulse if the quantity is less than twenty four.

27. The flash memory device of claim 19 wherein the address circuit comprises an X-interface circuit and a Y-interface circuit to select a block of flash cells in a flash memory device to undergo an erase.

28. The flash memory device of claim 19, further comprising:
- a charge pump circuit to generate an elevated voltage to apply approximately 5.4 volts to a control gate of the flash cell to read the flash cell;
- a first current to voltage conversion circuit to convert a read current in the flash cell to a read signal;
- a current source to generate a reference current to be approximately equal to current in a flash cell with a threshold voltage of 4.0 volts;
- a second current to voltage conversion circuit coupled to the current source to convert the reference current into a reference signal; and
- a comparator coupled to the first current to voltage conversion circuit and the second current to voltage conversion circuit to compare the read signal with the reference signal to generate a data signal indicating whether the flash cell is programmed or erased.

29. An information-handling system of the type including the flash memory device of claim 19, and further comprising:
- a processor;
- a display unit;
- an input/output subsystem; and
- a bus coupled to the processor, the flash memory device, the display unit, and the input/output subsystem.

30. A flash memory device comprising:
an array of flash cells; and means for erasing a flash cell in the array with an erase pulse having an adjustable length.

31. A method of operating a flash memory device comprising:
- selecting a flash cell in a flash memory device to undergo an erase;
- applying a long erase pulse to the flash cell;
- reading the flash cell;
- for each time the flash cell is read and is not in an erased state:
  - applying a short erase pulse to the flash cell;
  - counting the short erase pulse; and
  - reading the flash cell; and
- adjusting a length of the long erase pulse based on the counted number of short erase pulses that were applied to the flash cell comprising:
  - increasing a length of the long erase pulse if the counted number of short erase pulses is more than a high number of pulses; and
  - decreasing the length of the long erase pulse if the counted number of short erase pulses is less than a low number of pulses.

32. The method of claim 31 wherein:
adjusting a length comprises:
- calculating a quantity representing short erase pulses applied to the flash cell over a selected number of prior erases of the flash cell and the erase of the flash cell including the counted number of short erase pulses;
- increasing a length of the long erase pulse if the quantity is more than a high limit; and
- decreasing the length of the long erase pulse if the quantity is less than a low limit;
selecting a flash cell comprises selecting a word line and a bit line coupled to a flash cell in response to address signals;
reading the flash cell comprises:
- applying approximately 5.4 volts to a control gate of the flash cell and sensing a read current in the flash cell;
- converting the read current into a read signal in a first current to voltage conversion circuit;
- generating a reference current in a current source to be approximately equal to current in a flash cell with a threshold voltage of 4.0 volts;
- converting the reference current into a reference signal in a second current to voltage conversion circuit; and
- comparing the read signal with the reference signal in a comparator to generate a data signal indicating whether the flash cell is programmed or erased; and
further comprising ending the method if the counted number of short erase pulses exceeds an error limit.

33. A method of operating a flash memory device comprising:
- selecting a flash cell in a flash memory device to undergo an erase;
- applying a long erase pulse to the flash cell;
- reading the flash cell;
- for each time the flash cell is read and is not in an erased state:
  - applying a short erase pulse to the flash cell;
  - counting the short erase pulse; and
  - reading the flash cell; and
- adjusting a length of the long erase pulse based on the counted number of short erase pulses that were applied to the flash cell comprising:
  - calculating a quantity representing short erase pulses applied to the flash cell over a selected number of prior erases of the flash cell and the erase of the flash cell including the counted number of short erase pulses;
  - increasing a length of the long erase pulse if the quantity is more than a high limit; and
  - decreasing the length of the long erase pulse if the quantity is less than a low limit.

34. The method of claim 33 wherein:
adjusting a length comprises:
- adding a past average of short erase pulses applied to the flash cell prior to the application of the long erase pulse to the counted number of short erase pulses to equal a sum;
- calculating a quantity representing short erase pulses applied to the flash cell as being equal to the sum divided by two;
- increasing a length of the long erase pulse if the quantity is more than six;
- decreasing the length of the long erase pulse if the quantity is less than three; and
- wherein the past average is calculated in the same manner as the quantity for an immediately preceding erase of the flash cell;
selecting a flash cell comprises selecting a word line and a bit line coupled to a flash cell in response to address signals;
reading the flash cell comprises:
- applying approximately 5.4 volts to a control gate of the flash cell and sensing a read current in the flash cell;
- converting the read current into a read signal in a first current to voltage conversion circuit;
- generating a reference current in a current source to be approximately equal to current in a flash cell with a threshold voltage of 4.0 volts;

converting the reference current into a reference signal in a second current to voltage conversion circuit; and comparing the read signal with the reference signal in a comparator to generate a data signal indicating whether the flash cell is programmed or erased; and further comprising ending the method if the counted number of short erase pulses exceeds an error limit.

35. A method of operating a system comprising:

exchanging signals between a memory controller and a flash memory device;

selecting a flash cell in the flash memory device to undergo an erase based on the signals;

applying a long erase pulse to the flash cell;

reading the flash cell;

for each time the flash cell is read and is not in an erased state:
  applying a short erase pulse to the flash cell;
  counting the short erase pulse; and
  reading the flash cell; and adjusting a length of the long erase pulse based on the counted number of short erase pulses that were applied to the flash cell comprising:
  increasing a length of the long erase pulse if the counted number of short erase pulses is more than a high number of pulses; and
  decreasing the length of the long erase pulse if the counted number of short erase pulses is less than a low number of pulses.

36. The method of claim 35 wherein:

adjusting a length comprises:
  calculating a quantity representing short erase pulses applied to the flash cell over a selected number of prior erases of the flash cell and the erase of the flash cell including the counted number of short erase pulses;
  increasing a length of the long erase pulse if the quantity is more than a high limit; and
  decreasing the length of the long erase pulse if the quantity is less than a low limit;

selecting a flash cell comprises selecting a word line and a bit line coupled to a flash cell in response to address signals;

exchanging signals further comprises exchanging address signals, data signals, a chip enable signal, a write enable signal, a reset/power-down signal, an output enable signal, a write protect signal, and a status signal between a processor and the flash memory device over a bus;

reading the flash cell comprises:
  applying approximately 5.4 volts to a control gate of the flash cell and sensing a read current in the flash cell;
  converting the read current into a read signal in a first current to voltage conversion circuit;
  generating a reference current in a current source to be approximately equal to current in a flash cell with a threshold voltage of 4.0 volts;
  converting the reference current into a reference signal in a second current to voltage conversion circuit; and
  comparing the read signal with the reference signal in a comparator to generate a data signal indicating whether the flash cell is programmed or erased; and further comprising:
  ending the method if the counted number of short erase pulses exceeds an error limit; and
  exchanging signals between the processor, the flash memory device, a display unit, and an input/output subsystem over the bus.

37. A method of operating a system comprising:

exchanging signals between a memory controller and a flash memory device;

selecting a flash cell in the flash memory device to undergo an erase based on the signals;

applying a long erase pulse to the flash cell;

reading the flash cell;

for each time the flash cell is read and is not in an erased state:
  applying a short erase pulse to the flash cell;
  counting the short erase pulse; and
  reading the flash cell; and adjusting a length of the long erase pulse based on the counted number of short erase pulses that were applied to the flash cell comprising:
  calculating a quantity representing short erase pulses applied to the flash cell over a selected number of prior erases of the flash cell and the erase of the flash cell including the counted number of short erase pulses;
  increasing a length of the long erase pulse if the quantity is more than a high limit; and
  decreasing the length of the long erase pulse if the quantity is less than a low limit.

38. The method of claim 37 wherein:

adjusting a length comprises:
  adding a past average of short erase pulses applied to the flash cell prior to the application of the long erase pulse to the counted number of short erase pulses to equal a sum;
  calculating a quantity representing short erase pulses applied to the flash cell as being equal to the sum divided by two;
  increasing a length of the long erase pulse if the quantity is more than six;
  decreasing the length of the long erase pulse if the quantity is less than three; and
  wherein the past average is calculated in the same manner as the quantity for an immediately preceding erase of the flash cell;

selecting a flash cell comprises selecting a word line and a bit line coupled to a flash cell in response to address signals;

exchanging signals further comprises exchanging address signals, data signals, a chip enable signal, a write enable signal, a reset/power-down signal, an output enable signal, a write protect signal, and a status signal between a processor and the flash memory device over a bus;

reading the flash cell comprises:
  applying approximately 5.4 volts to a control gate of the flash cell and sensing a read current in the flash cell;
  converting the read current into a read signal in a first current to voltage conversion circuit;
  generating a reference current in a current source to be approximately equal to current in a flash cell with a threshold voltage of 4.0 volts;
  converting the reference current into a reference signal in a second current to voltage conversion circuit; and
  comparing the read signal with the reference signal in a comparator to generate a data signal indicating whether the flash cell is programmed or erased; and further comprising:
  ending the method if the counted number of short erase pulses exceeds an error limit; and
  exchanging signals between the processor, the flash memory device, a display unit, and an input/output subsystem over the bus.

39. An information handling system comprising:

a flash memory device comprising:
  an address circuit to select a flash cell in a flash memory device to undergo an erase; and
  a control circuit comprising elements to:
    apply a long erase pulse to the flash cell;
    read the flash cell;
    for each time the flash cell is read and is not in an erased state:
      apply a short erase pulse to the flash cell;
      count the short erase pulse; and
      read the flash cell; and
    adjust a length of the long erase pulse based on the counted number of short erase pulses that were applied to the flash cell;

a processor;

a display unit;

an input/output subsystem; and a bus coupled to the processor, the flash memory device, the display unit, and the input/output subsystem.

40. The information handling system of claim 39 wherein:

the control circuit further comprises elements to:
  calculate a quantity representing short erase pulses applied to the flash cell over a selected number of prior erases of the flash cell and the erase of the flash cell including the counted number of short erase pulses;
  increase a length of the long erase pulse if the quantity is more than a high limit; and
  decrease the length of the long erase pulse if the quantity is less than a low limit;

the address circuit comprises an X-interface circuit and a Y-interface circuit to select a block of flash cells in a flash memory device to undergo an erase; and further comprising:
  a charge pump circuit to generate an elevated voltage to apply approximately 5.4 volts to a control gate of the flash cell to read the flash cell;
  a first current to voltage conversion circuit to convert a read current in the flash cell to a read signal;
  a current source to generate a reference current to be approximately equal to current in a flash cell with a threshold voltage of 4.0 volts;
  a second current to voltage conversion circuit coupled to the current source to convert the reference current into a reference signal; and
  a comparator coupled to the first current to voltage conversion circuit and the second current to voltage conversion circuit to compare the read signal with the reference signal to generate a data signal indicating whether the flash cell is programmed or erased.

* * * * *